(12) United States Patent
Mori et al.

(10) Patent No.: US 7,352,310 B2
(45) Date of Patent: Apr. 1, 2008

(54) RECEIVING DEVICE AND AUTOMATIC GAIN CONTROL METHOD

(75) Inventors: Hiroki Mori, Kawasaki (JP); Takeshi Ueno, Kawasaki (JP); Kazumi Sato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/753,819

(22) Filed: May 25, 2007

(65) Prior Publication Data
US 2007/0229333 A1    Oct. 4, 2007

Related U.S. Application Data

(62) Division of application No. 11/392,661, filed on Mar. 30, 2006, now Pat. No. 7,292,169.

(30) Foreign Application Priority Data
Nov. 17, 2005   (JP)   ............... 2005-333311

(51) Int. Cl.
*H03M 1/62* (2006.01)
(52) U.S. Cl. ...................... 341/139; 341/156
(58) Field of Classification Search ................ 341/139, 341/156, 161, 162, 163
See application file for complete search history.

(56) References Cited

U.S. PATENT DOCUMENTS 5,758,274 A * 5/1998 Vu et al. ................. 455/246.1
5,917,865 A    6/1999 Kopmeiners et al.
6,498,927 B2 * 12/2002 Kang et al. ............... 455/245.2
6,843,597 B1    1/2005 Li et al.
6,952,132 B2   10/2005 Bhattacharjee et al.
7,222,037 B2 *  5/2007 Mushirahad et al. ........ 702/107

FOREIGN PATENT DOCUMENTS

GB    2229333    9/1990
JP    10-56343   2/1998

* cited by examiner

*Primary Examiner*—Brian Young
(74) *Attorney, Agent, or Firm*—Oblon, Spivak, McClelland, Maier & Neustadt, P.C.

(57) ABSTRACT

A receiving device includes a receiver; a frequency converter; an A/D converter; and a digital signal processor, wherein the A/D converter includes a variable gain amplifier adjusting a signal level of the analog signal from the frequency converter; an A/D converting portion converting an analog signal from the variable gain amplifier into an m-bit digital signal and an n-bit digital signal and outputting the m-bit digital signal and the n-bit digital signal, the n-bit digital signal serving as an output signal to the digital signal processor; and a gain controller calculating a coarse adjustment gain of the variable gain amplifier on the basis of a power of the m-bit digital signal to control the gain of the variable gain amplifier and calculating a fine adjustment gain on the basis of a power of the n-bit digital signal to control the gain of the variable gain amplifier.

6 Claims, 9 Drawing Sheets

RECEIVING DEVICE AND AUTOMATIC GAIN CONTROL METHOD

CROSS-REFERENCE TO RELATED APPLICATION

This application is a divisional of U.S. application Ser. No. 11/392,661 filed Mar. 30, 2006 now U.S. Pat. No. 7,292,169, and is based upon and claims the benefit of priority from the prior Japanese Patent Applications No. 2005-333311, filed on Nov. 17, 2005, the entire contents of each of which are incorporated herein by reference.

BACKGROUND OF THE INVENTION

1. Field of the Invention

The present invention relates to a receiving device and an automatic gain control method.

2. Related Art

In a conventional receiver, in order to keep the level of an input signal to an A/D converter constant, the level of the input signal is adjusted by using a variable gain amplifier. The gain of the variable gain amplifier is controlled depending on the level of a received signal and the level of an output signal from the A/D converter. This control is called automatic gain control (AGC).

As a method of automatic gain control, a method obtained by combining a feedforward control method and a feedback control method is known (for example Japanese Patent Publication Laid-open No. 10-56343 (p. 3 and FIG. 1) to be referred to as Patent Document 1 hereinafter).

In the automatic gain control method described in Patent Document 1, the RSSI (Received Signal Strength Indicator) of an analog received signal which has not been input to a variable gain amplifier is detected by a RSSI detector, and AGC coarse adjustment for controlling the gain of the variable gain amplifier is performed on the basis of the RSSI (feedforward control). After the AGC coarse adjustment is performed, a power of a digital signal converted by the A/D converter is measured by a power measurement unit. On the basis of the measured power, AGC fine adjustment for controlling the gain of the variable gain amplifier is performed (feedback control).

In this manner, according to the automatic gain control method described in Patent Document 1, the automatic gain control is performed in two steps of the AGC coarse adjustment and the AGC fine adjustment. For this reason, control time can be made shorter than that in an automatic gain control method which feedback control is performed a plurality of times on the basis of the power of a digital signal serving as a result of A/D conversion.

As described above, in the invention described in Patent Document 1, although automatic gain control can be increased in speed, a RSSI detector must be additionally arranged to perform AGC coarse adjustment. For this reason, a circuit scale increases and a power consumption disadvantageously increase. In particular, since a mobile terminal or the like requires a small size and a low power consumption, the problem of the circuit scale is serious for the mobile terminal or the like.

SUMMARY OF THE INVENTION

An advantage of an aspect of the present invention is to provide a receiver and an automatic gain control method which can be reduced in size and have low power dissipation.

A receiving device according to an embodiment of the present invention includes a receiver receiving a radio signal; a frequency converter converting a frequency of an analog signal from the receiver; an A/D converter converting the analog signal into a digital signal; and a digital signal processor processing the digital signal to obtain received data, wherein the A/D converter includes: a variable gain amplifier adjusting a signal level of the analog signal; an A/D converting portion converting the analog signal from the variable gain amplifier into an m-bit digital signal and an n-bit (n>m) digital signal and outputting the m-bit digital signal and the n-bit digital signal, the n-bit digital signal serving as an output signal to the digital signal processor; and a gain controller calculating a coarse adjustment gain of the variable gain amplifier on the basis of a power of the m-bit digital signal to control the gain of the variable gain amplifier and calculating a fine adjustment gain on the basis of a power of the n-bit digital signal to control the gain of the variable gain amplifier.

A receiving device according to an embodiment of the present invention includes a receiver receiving a radio signal; a frequency converter converting a frequency of an analog signal from the receiver; an A/D converter converting the analog signal into a digital signal; and a digital signal processor processing the digital signal to obtain received data, wherein the A/D converter includes: a variable gain amplifier adjusting a signal level of the analog signal from the frequency converter; a quadrature detector separating a signal from the variable gain amplifier to an in-phase component and an quadrature component; a first low-pass filter removing higher harmonic waves included in the in-phase component of the analog signal from the quadrature detector; a second low-pass filter removing higher harmonic waves included in the quadrature component of the analog signal from the quadrature detector; a first A/D converting portion converting an analog signal from the first low-pass filter into an m-bit digital signal of the in-phase component and an n-bit (n>m) digital signal of the in-phase component and outputting the m-bit digital signal and the n-bit digital signal of the in-phase component, the n-bit digital signal of the in-phase component serving as an output signal to the digital signal processor; a second A/D converting portion converting an analog signal from the second low-pass filter into an m-bit digital signal of the quadrature component and an n-bit digital signal of the quadrature component and outputting the m-bit digital signal and the n-bit digital signal of the quadrature component, the n-bit digital signal of the quadrature component serving as an output signal to the digital signal processor; a gain controller calculating a coarse adjustment gain of the variable gain amplifier on the basis of a power of the m-bit digital signal of the in-phase component and the m-bit digital signal of the quadrature component to control the gain of the variable gain amplifier and calculating a fine adjustment gain on the basis of a power of the n-bit digital signal of the in-phase component and the n-bit digital signal of the quadrature component to control the gain of the variable gain amplifier.

A receiving device according to an embodiment of the present invention includes a receiver receiving a radio signal; a frequency converter converting a frequency of an analog signal from the receiver; an A/D converter converting the analog signal into a digital signal; and a digital signal processor processing the digital signal to obtain received data, wherein the A/D converter includes: a variable gain amplifier adjusting a signal level of the analog signal from the frequency converter; a quadrature detector separating a signal from the variable gain amplifier to an in-phase component and an quadrature component; a first low-pass filter removing higher harmonic waves included in the in-phase component of the analog signal from the quadrature detector; a second low-pass filter removing higher harmonic waves included in the quadrature component of the analog signal from the quadrature detector; a first A/D converting portion converting an analog signal from the first low-pass filter into an n-bit digital signal of the in-phase component, the n-bit digital signal of the in-phase component serving as an output signal to the digital signal processor; a second A/D converting portion converting an analog signal from the second low-pass filter into an n-bit digital signal of the quadrature component, the n-bit digital signal of the quadrature component serving as an output signal to the digital signal processor; a first overflow detector detecting whether the first A/D conversion portion is saturated when the analog signal is input to the first A/D conversion portion; a second overflow detector detecting whether the second A/D conversion portion is saturated when the analog signal is input to the second A/D conversion portion; a gain controller calculating a coarse adjustment gain which decreases a gain of the variable gain amplifier to control the gain of the variable gain amplifier when the first or the second overflow detector detects that the first or the second A/D conversion portion is saturated, and which, thereafter, calculating a fine adjustment gain obtained to control the gain of the variable gain amplifier by correcting the coarse adjustment gain on the basis of powers of the n-bit in-phase component digital signal and the n-bit quadrature component digital signal.

An automatic gain control method according to an embodiment of the present invention includes converting an input analog signal into an m-bit digital signal and an n-bit (n>m) digital signal serving as an output signal by using an A/D conversion potion; calculating a coarse adjustment gain of a variable gain amplifier on the basis of a power of the m-bit digital signal to adjust a signal level of the analog signal before the A/D conversion; and calculating a fine adjustment gain of the variable gain amplifier on the basis of a power of the n-bit digital signal to adjust a signal level of the analog signal, the level of which is adjusted in the calculation of the coarse adjustment gain.

An automatic gain control method according to an embodiment of the present invention includes converting an input analog signal into an n-bit digital signal serving as an output signal by using an A/D conversion potion; detecting whether the A/D conversion portion is over-flowed when the analog signal inputted to the first A/D conversion portion; in a case that the A/D conversion portion is over-flowed, calculating a coarse adjustment gain of a variable gain amplifier to adjust a signal level of the analog signal before the A/D conversion; and calculating a fine adjustment gain of the variable gain amplifier on the basis of a power of the n-bit digital signal to adjust a signal level of the analog signal, the level of which is adjusted in the calculation of the coarse adjustment gain.

DETAILED DESCRIPTION OF THE INVENTION

Embodiments of the present invention will be described below with reference to the accompanying drawings.

First Embodiment

A schematic configuration of a receiver according to a first embodiment will be described below with reference to FIG. 1.

Figure 1:
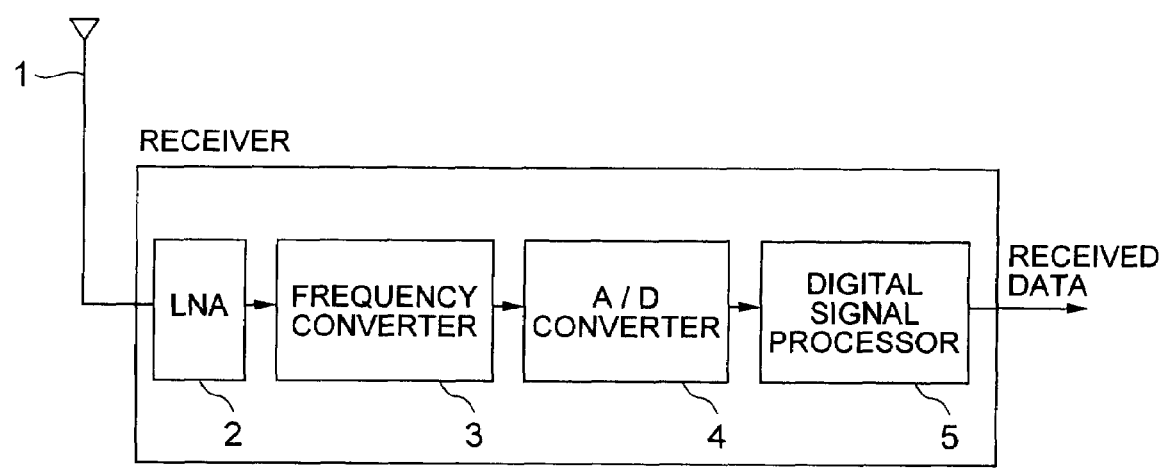
FIG. 1 is a block diagram showing a configuration of a receiver according to a first embodiment of the present embodiment.

The receiver shown in FIG. 1 includes an antenna 1 which receives a high-frequency radio signal, a low-noise amplifier (LNA) 2 which amplifies a signal received by the antenna 1 with low noise, a frequency converter 3 which converts an output signal from the low-noise amplifier 2 to an intermediate frequency signal, an A/D converter 4 which converts a signal output from the frequency converter 3 from an analog signal to a digital signal, and a digital signal processor 5 which processes the digital signal output from the A/D converter 4 to obtain receiving data.

The embodiment relates to automatic gain control executed by the A/D converter 4 of the receiver. Therefore, the configuration and the operation of the receiver will be described below in detail with focusing on the A/D converter 4.

The first embodiment will be described below with reference to FIGS. 2 to 5.

Figure 2:
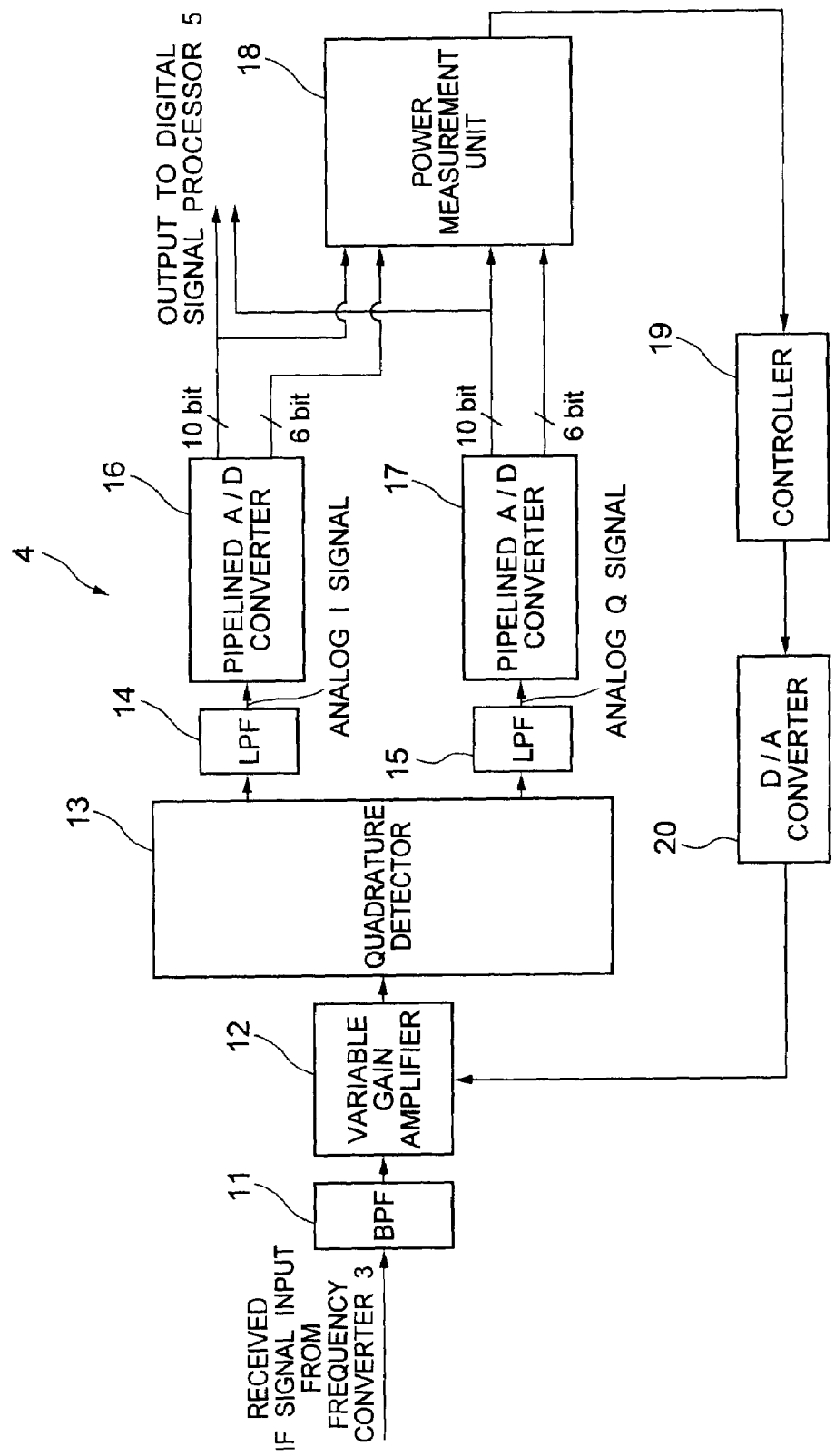
FIG. 2 is a block diagram showing a configuration of an A/D converter according to a first embodiment of the present embodiment.
Figure 3:
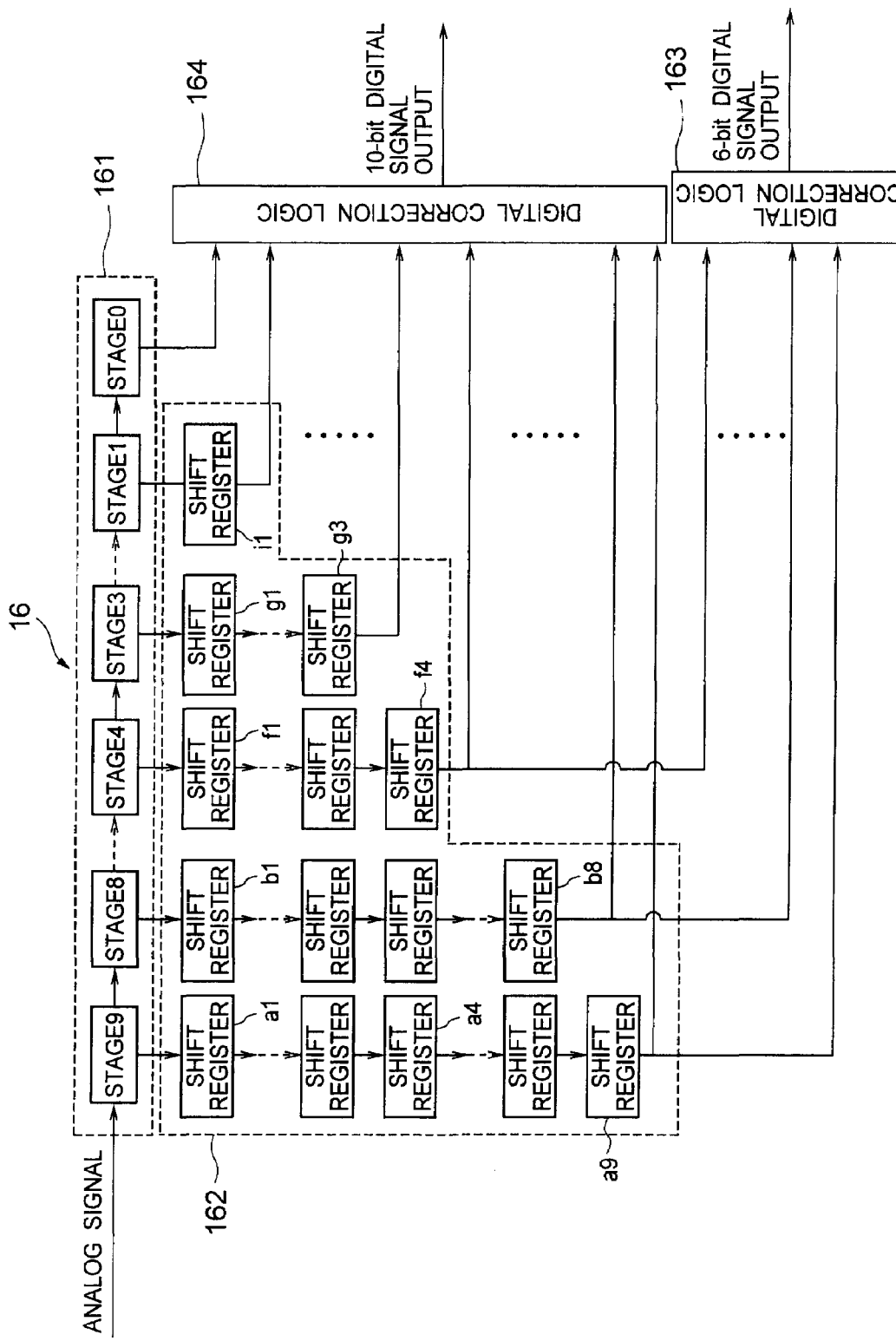
FIG. 3 is a block diagram showing a configuration of a 10-bits-pipelined A/D converters an A/D converter according to a first embodiment of the present embodiment.

FIG. 2 is a diagram showing the detailed configuration of the A/D converter 4 according to the first embodiment. The A/D converter 4 shown in FIG. 2 includes a band-pass filter 11 (to be referred to as a BPF 11 hereinafter) for limiting a band, a variable gain amplifier 12 which adjusts the signal level of a received IF signal which passes through the BPF 11, a quadrature detector 13 which separates the received IF signal output from the variable gain amplifier 12 to in-phase components and quadrature components, low-pass filters 14 and 15 (to be referred to as LPFs 14 and 15 hereinafter) which remove higher harmonic waves included in the components of the received IF signal output from the quadrature detector 13, and pipelined A/D converters 16 and 17 which convert the components from analog signals to digital signals, the components being output from the LPFs 14 and 15 and the higher harmonic waves are removed from the components. The pipelined A/D converters 16 and 17 output 10-bit digital signals as final conversion results and output 6-bit digital signals as intermediate conversion results. The details of the pipelined A/D converters 16 and 17 will be described later.

The A/D converter 4 further includes a power measurement unit 18 which measures the power of the A/D-converted digital signal, a controller 19 which controls the gain of the variable gain amplifier 12 on the basis of the power measured by the power measurement unit 18, and a D/A converter 20 which converts an output signal from the controller 19 from a digital signal to an analog signal to supply the analog signal to the variable gain amplifier 12.

The detailed configurations of the pipelined A/D converters 16 and 17 will be described below with reference to FIGS. 3A and 3B.

The pipelined A/D converters 16 and 17 are arranged in units of the in-phase components and the quadrature components of the received IF signal. However, since the pipelined A/D converters 16 and 17 have almost the same configurations, the configuration of the pipelined A/D converter 16 which converts an in-phase component of the received IF signal will be described below.

The pipelined A/D converter 16 includes a stage 161 constituted by a stage K (K=0 to 9), a shift register group 162 obtained by connecting shift registers to each other in multistage to adjust the output timings of digital signals output from the stages K of the stage 161, a 6-bit digital correction logic 163 to which a 6-bit output signal of previous-stage from the shift register group 162 is provided, and a 10-bit digital correction logic 164 to which output signals of all bits from the shift register group 162 are supplied.

The stages K are sequentially connected in series with each other from stage 9. When an analog signal from the LPF 14 is input to stage 9, the signal is sequentially sent from stage 9 to stage 8, . . . , stage 0 bit by bit. Each of the stages K conduct 1-bit-quantization of the analog signals from stage 9 to 0 according to clock timings, and it outputs the quantization results. Since the quantization results are output at timings at which quantization is performed at the stages K, the results are sequentially output from the stages 9 to 0 at 1-clock-intervals. In order to adjust the output timings of the quantization results, the quantization results are input to the shift register group 162.

In this case, the shift register group 162 is arranged to delay a 1-bit signal by one clock. In order to adjust the output timing of the quantization result at stage 9 to the output timing of the quantization result at stage 0, nine shift registers (a1 to a9 in the shift register group 162) are connected in series with each other for stage 9. Similarly, eight shift registers (b1 to b8 in the shift register group 162) are connected in series with each other for stage 8. Similar configurations are applied to the subsequent stages, respectively. Stage 0 serving as the final stage is connected to the 10-bit digital correction logic 164.

As described above, of the quantization results the output timings of which are adjusted, the output results of stage 9 to stage 4 are input to the 6-bit digital correction logic 163. After gain error correction is performed on the output results by the 6-bit digital correction logic 163, a 6-bit digital signal is output. Output results of stage 9 to stage 0 are input to the 10-bit digital correction logic 164. After gain error correction is performed on the output results by the 10-bit digital correction logic 164, a 10-bit digital signal is output.

At the stages K (K=0 to 9), an analog signal is quantized bit by bit. However, the analog signal may be quantized by a plurality of bits. Furthermore, a multi-bit shift operation may be performed by one shift register.

An operation of the A/D converter 4 will be described below with reference to FIGS. 4 to 5. A frame configuration of a wireless packet signal obtained when the receiver according to the present invention is applied to a wireless LAN serving as a wireless system will be explained with reference to FIG. 4, and the operation of the A/D converter 4 when the wireless packet signal is received will be explained with reference to FIG. 5.

Figure 4:
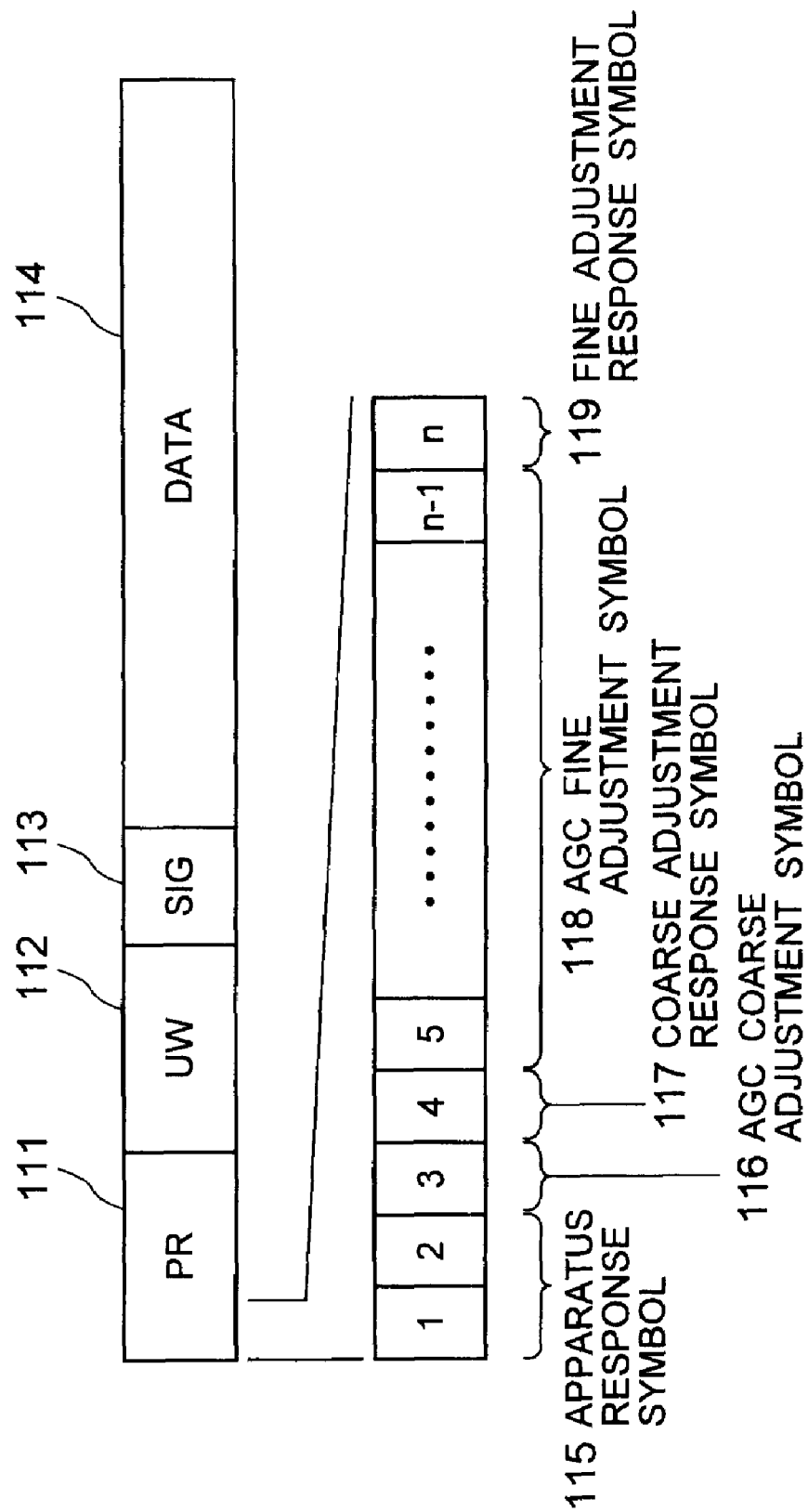
FIG. 4 is a diagram showing a wireless frame configuration according to a first embodiment of the present embodiment.
Figure 5:
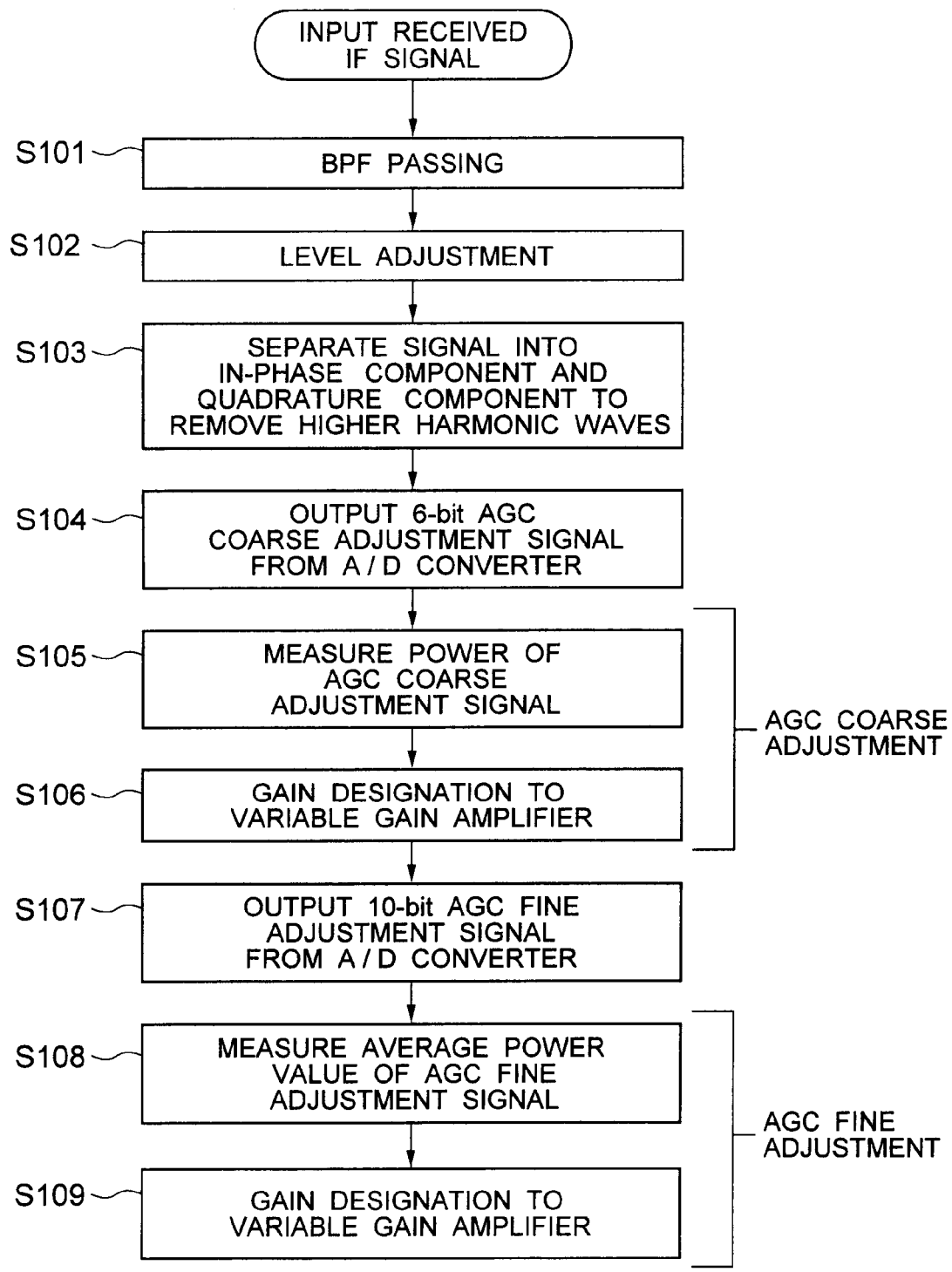
FIG. 5 is a flow chart showing an operation of an A/D converter according to a first embodiment of the present embodiment.

The upper side in FIG. 4 shows a frame configuration of a wireless packet signal in IEEE802.11a/g which is a standard for a wireless LAN. The wireless packet signal includes a preamble section (PR) 111 which is arranged at the start and used in automatic gain control, carrier/clock reproduction, or the like, a unique word section (UW) 112 used in frame synchronization, a signal section (SIG) 113 which transmits information such as a transmission rate or a data length, and an information section (DATA) 114 which indicates data itself in the order named. Of these sections, the preamble section 111 is constituted by a plurality of symbols, and some symbols (n symbols in this case) are used in automatic gain control.

The lower side in FIG. 4 shows the configuration of a part mainly used in automatic gain control in the preamble section 111 for a wireless packet signal. The first and second symbols are apparatus response symbols 115 corresponding to response time until the A/D converter 4 is started. One symbol subsequent to the apparatus response symbol 115 is an AGC coarse adjustment symbol 116 used in AGC coarse adjustment. The AGC coarse adjustment will be described later. One symbol subsequent to the AGC coarse adjustment symbol 116 is a coarse adjustment response symbol 117. The coarse adjustment response symbol 117 corresponds to response time until a gain of the variable gain amplifier 12 becomes stable after the AGC coarse adjustment. n−5 symbols from the symbol subsequent to the AGC coarse adjustment symbol 116 to symbol n−1 are AGC fine adjustment symbols 118 used in AGC fine adjustment. The AGC fine adjustment will be described later. The final symbol n is a fine adjustment response symbol 119 corresponding to response time until a gain of the variable gain amplifier 12 becomes stable after AGC fine adjustment.

An operation of the A/D converter 4 when the wireless packet signal is received will be described below with reference to the flow chart in FIG. 5.

When a received IF signal is input to the A/D converter 4, the A/D converter 4 takes the time, which is corresponds to the apparatus response symbol 115, to start. The input received IF signal passes through the BPF 11 for band limiting to be limited in a certain bandwidth (step 101).

The received IF signal passing through the BPF 11 is input to the variable gain amplifier 12 and adjusted at a level corresponding to a gain set in the variable gain amplifier 12 (step 102). The received IF signal amplified in the variable gain amplifier 12 is separated into an in-phase component and an quadrature component in the quadrature detector 13. The in-phase component and the quadrature component pass through the LPFs 14 and 15, respectively to remove higher harmonic waves from the components (step 103). In this case, the in-phase component of the received IF signal passing through the LPF 14 is called an analog I signal, and the quadrature component of the received IF signal passing through the LPF 15 is called an analog Q signal.

The analog I signal is input to the pipelined A/D converter 16, and the analog Q signal is input to the pipelined A/D converter 17, so that the analog I signal and the analog Q signal are converted into a digital I signal and a digital Q signal, respectively. The digital I signal and the digital Q signal which are input to the pipelined A/D converters 16 and 17 to be firstly 6-bit-A/D-converted are output to the power measurement unit 18 as AGC coarse adjustment signals (step 104).

The power measurement unit 18 generates an AGC coarse adjustment power obtained by converting the AGC coarse adjustment signal into a dB (decibel) value and outputs the AGC coarse power to the controller 19 (step 105).

In the controller 19, on the basis of the AGC coarse adjustment power and the optimum level of an input signal to an A/D converter, a first gain at which the output from the variable gain amplifier 12 is estimated to have the optimum signal level is calculated. A coarse gain control signal which designates the gain of the variable gain amplifier 12 is generated and output to the D/A converter 20. Since the coarse adjustment gain control signal generated and output by the controller 19 is a digital signal, the coarse adjustment gain control signal is converted into an analog signal by the D/A converter 20, and the analog signal is given to the variable gain amplifier 12 as a gain designation signal (step 106).

Automatic gain control using the AGC coarse adjustment signal is called AGC coarse adjustment, and is performed by using the AGC coarse adjustment symbol 116 shown in FIG. 4.

After the A/D converter 4 waits for time corresponding to the coarse adjustment response symbol 117 until gain designation performed by a coarse adjustment gain control signal is reflected on the variable gain amplifier 12, the A/D converter 4 performs AGC fine adjustment by using the AGC fine adjustment symbols 118 of the received IF signal. The AGC fine adjustment is executed as follows.

At first, the AGC fine adjustment symbols 118 are A/D-converted into a 10-bit digital I signal and a 10-bit digital Q signal at the pipelined A/D converters 16 and 17, respectively. The digital I signal and the digital Q signal are output to the digital signal processor 5 connected to the output of the A/D converter 4, and are input to the power measurement unit 18 as AGC fine adjustment signals, respectively. The power measurement unit 18 generates an AGC fine adjustment power obtained by converting the AGC fine adjustment signals into dB (decibel) values and output to the controller 19 (step 107).

The controller 19 observes the fine adjustment powers input from the power measurement unit 18 throughout a period in which the AGC fine adjustment symbols 118 are successive to calculate the average of the fine adjustment powers (step 108). Thereafter, on the basis of the average and the optimum level of the input signal to the A/D converter, a second gain at which an output from the variable gain amplifier 12 has an optimum signal level is calculated, and a fine adjustment gain control signal which designates the gain of the variable gain amplifier 12 is generated and output to the D/A converter 20. Since the fine adjustment gain control signal generated and output by the controller 19 is a digital signal, the digital signal is converted into an analog signal by the D/A converter 20. The analog signal is applied to the variable gain amplifier 12 as a gain designation signal (step 109). After the A/D converter 4 waits for time corresponding to the fine adjustment response symbol 119 until the gain designation obtained by the fine adjustment gain control signal is reflected on the variable gain amplifier 12, the remaining wireless frame subsequent to the fine adjustment response symbol 119 is A/D-converted.

In this case, the gain of the variable gain amplifier 12 calculated by the controller 19 may be set such that outputs from the pipelined A/D converters 16 and 17 are not saturated, for example, the amplitudes of the signals input to the pipelined A/D converters 16 and 17 are about ¼ to ½ of the full scale. Furthermore, the saturation level may be lowered to set the gain such that a desired dynamic range is satisfied.

As described above, according to the first embodiment, AGC coarse adjustment of the variable gain amplifier 12 is performed by using intermediate results of conversion in the pipelined A/D converters 16 and 17, so that a RSSI detector need not be additionally arranged for AGC coarse adjustment, and further the pipelined A/D converters 16 and 17 which can output the intermediate results can be realized in almost the same scale of circuit as that of a conventional pipelined A/D converter. For this reason, a reduction in circuit scale and a reduction in power consumption can be achieved. Since a signal input to or output from the power measurement unit 18 is a digital signal, information, which is more stable than information obtained by converting the RSSI of an analog signal into a digital signal, can be supplied to the controller 19. In addition, since automatic gain control is performed in two steps, the control can be performed at a high speed. In this manner, a preamble signal for automatic gain control can be shortened, and preamble signals for time synchronization or frequency synchronization can be longly assured. That is, a ratio of other signals to a packet length can be increased.

Second Embodiment

Figure 6:
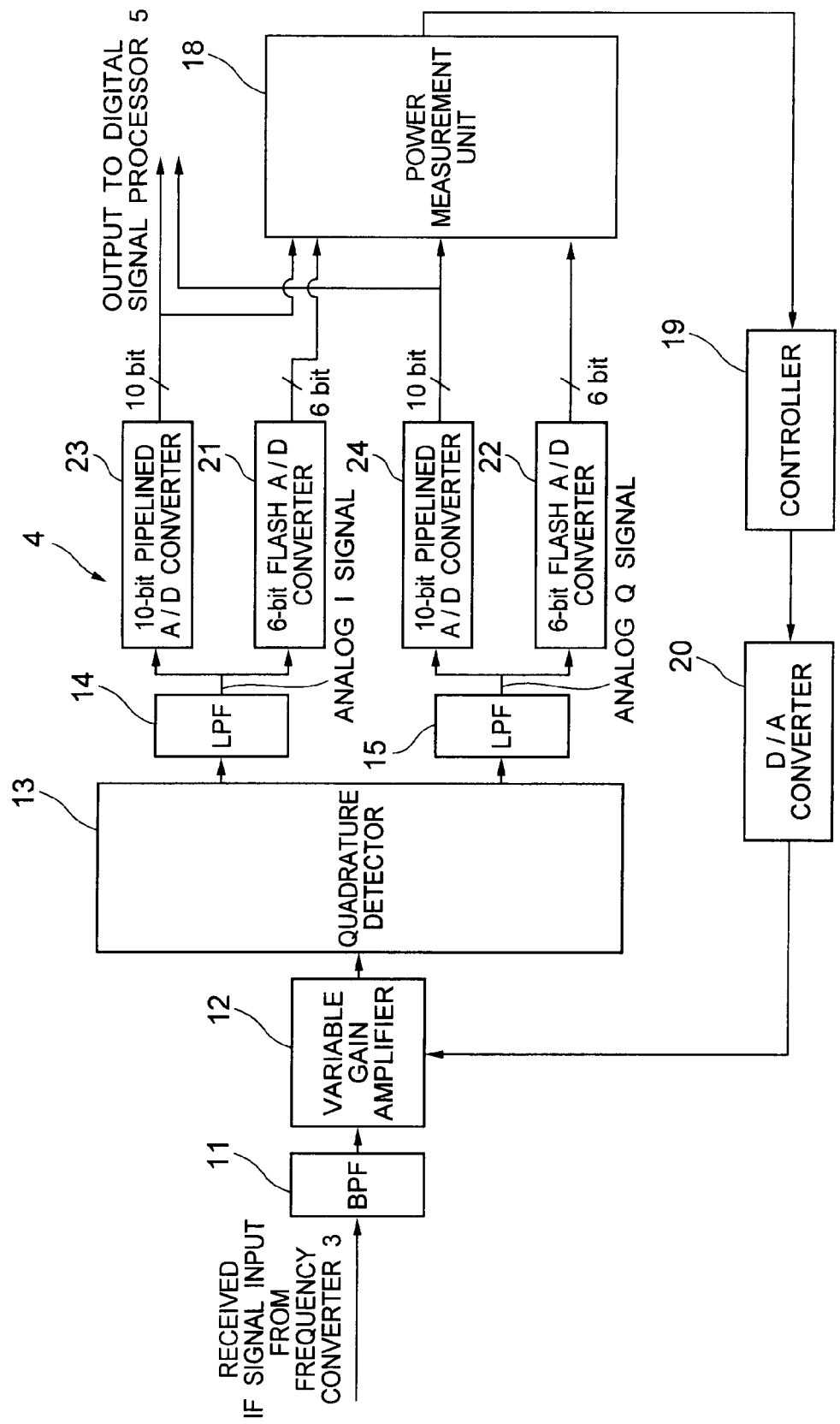
FIG. 6 is a block diagram showing a configuration of a receiver according to a second embodiment of the present embodiment.
Figure 7:
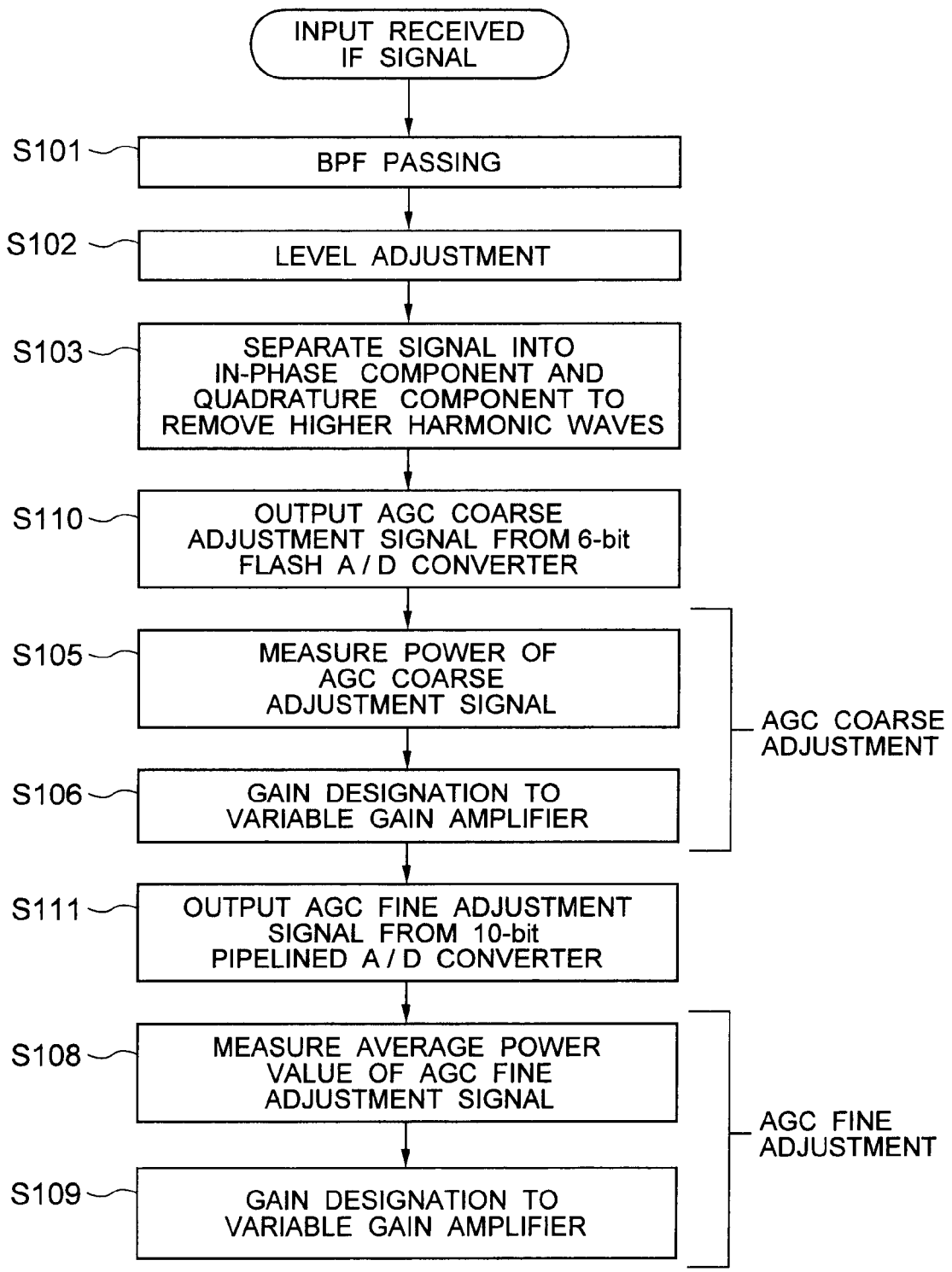
FIG. 7 is a flow chart showing an operation of an A/D converter according to a second embodiment of the present embodiment.

A second embodiment of the present invention will be described below with reference to FIGS. 6 and 7. FIG. 6 is a diagram of an A/D converter 4 according to the second embodiment. The same reference numerals as in the A/D converter 4 shown in FIG. 2 denote the same parts in the configuration of the A/D converter 4 according to the second embodiment, and a description thereof will be omitted.

The A/D converter 4 according to the second embodiment includes 6-bit flash A/D converters 21 and 22 and 10-bit pipelined A/D converters 23 and 24. The 6-bit flash A/D converters 21 and 22 output 6-bit A/D conversion results corresponding to input signals from LPFs 14 and 15 to the power measurement unit 18. The 10-bit pipelined A/D converters 23 and 24 do not output intermediate results of A/D conversion of the input signals from the LPFs 14 and 15. Unlike the pipelined A/D converters 6 and 7 shown in FIG. 2, the 10-bit pipelined A/D converters 23 and 24 output only the 10-bit A/D conversion results to the digital signal processor 5 and the power measurement unit 18 following to the outputs of the 10-bit pipelined A/D converters 23 and 24.

Since a frame configuration of a wireless packet signal received by the receiver according to the embodiment is the same as the configuration of the first embodiment, a description thereof will be omitted.

An operation of the A/D converter 4 according to the second embodiment, when the wireless packet signal is received, will be described below with reference to FIG. 7. The same reference numerals as in FIG. 5 denote the same steps in FIG. 7, and a description thereof will be omitted.

The received signal, as in the first embodiment, is separated into an analog I signal and an analog Q signal (step 101 to step 103). Thereafter, the analog I signal is input to the 6-bit flash A/D converter 21 and the 10-bit pipelined A/D converter 23, and the analog Q signal is input to the 6-bit flash A/D converter 22 and the 10-bit pipelined A/D converter 24. The analog I signal and the analog Q signal input to the 6-bit flash A/D converters 21 and 22 are converted into a 6-bit digital I signal and a 6-bit digital Q signal. The 6-bit digital I signal and the 6-bit digital Q signal are output to the power measurement unit 18 as AGC coarse adjustment signals (step 110). After the input, as in the first embodiment, AGC coarse adjustment is performed on the variable gain amplifier 12 (step 105 and step 106).

Thereafter, the digital I signal and the digital Q signal converted by the 10-bit pipelined A/D converters 23 and 24 are output to the digital signal processor 5 and output to the power measurement unit 18 as AGC fine adjustment signals (step 111). After the input, as in the first embodiment, AGC fine adjustment is performed on the variable gain amplifier 12 (step 108 and step 109).

As described above, according to the second embodiment, the AGC coarse adjustment of the variable gain amplifier 12 is performed by using the outputs from the 6-bit flash A/D converters 21 and 22, so that a RSSI detector need not be additionally prepared for AGC coarse adjustment. For this reason, a reduction in circuit scale and a reduction in power consumption can be achieved. Since signals input to or output from the power measurement unit 18 are digital signals, information which is more stable than information obtained by converting the RSSI of an analog signal into a digital signal can be supplied to the controller 19. In addition, since automatic gain control is performed in two steps, the control can be performed at a high speed. In this manner, a preamble signal for automatic gain control can be shortened, and preamble signals for time synchronization or frequency synchronization can be longly assured. That is, a ratio of other signals to a packet length can be increased.

Third Embodiment

Figure 8:
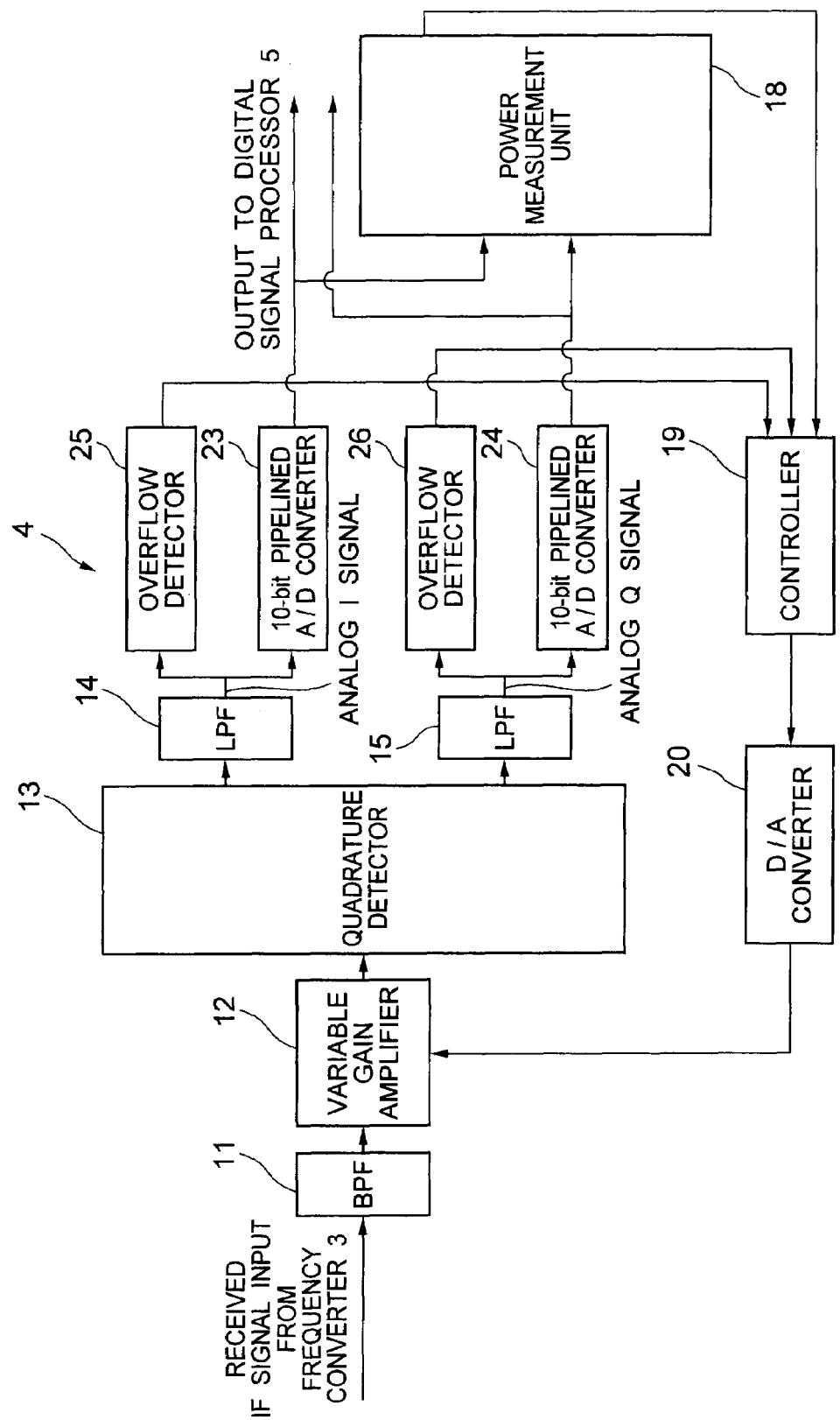
FIG. 8 is a block diagram showing a configuration of a receiver according to a third embodiment of the present embodiment.
Figure 9:
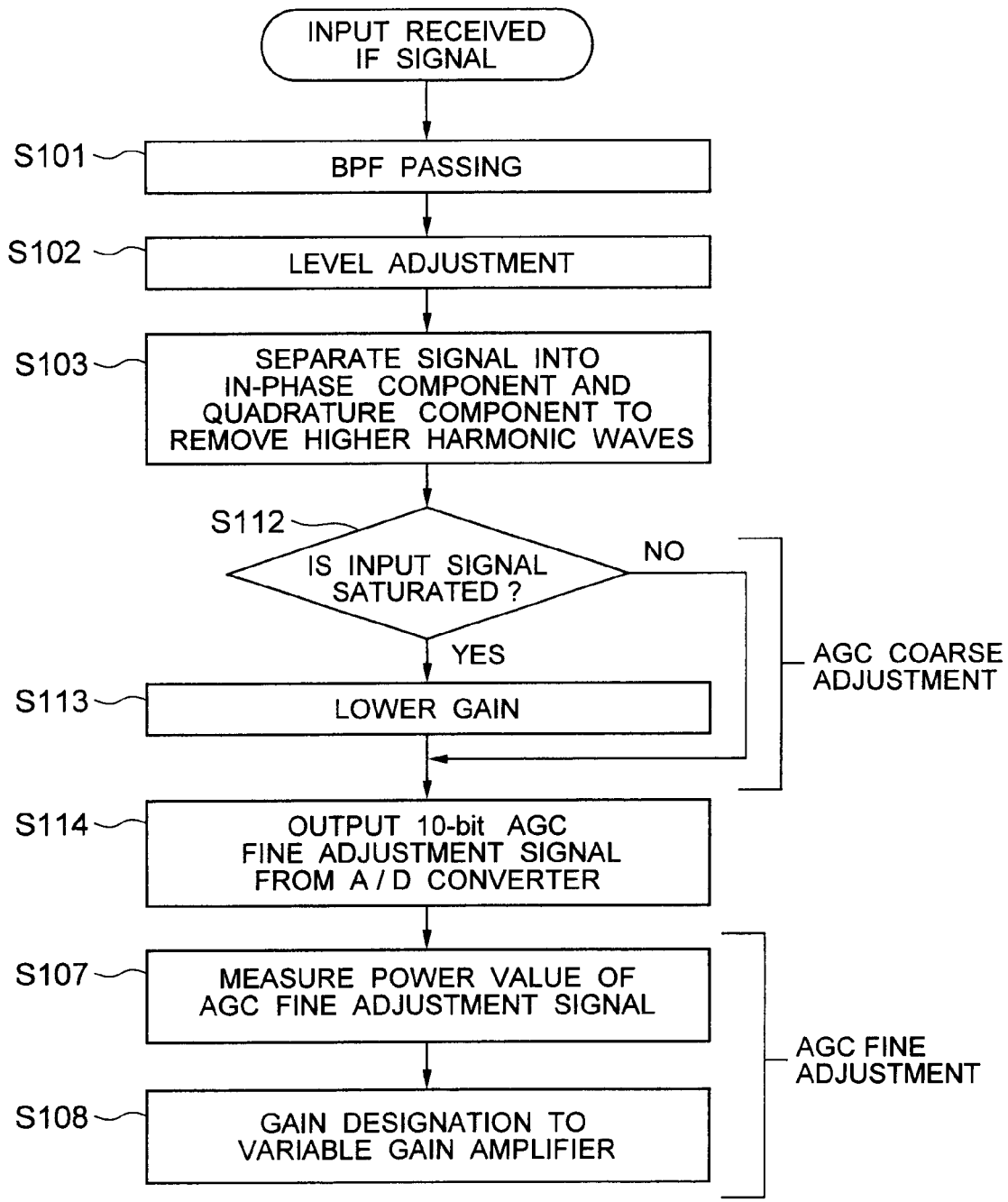
FIG. 9 is a flow chart showing an operation of an A/D converter according to a third embodiment of the present embodiment.

The third embodiment of the present invention will be described below with reference to FIGS. 8 and 9. FIG. 8 is a diagram of an A/D converter 4 according to the third embodiment. The same reference numerals as in the A/D converter 4 shown in FIG. 2 denote the same parts in the configuration of the A/D converter 4 according to the third embodiment, and a description thereof will be omitted.

The A/D converter 4 according to the third embodiment has overflow detectors 25 and 26 in place of the 6-bit flash A/D converters 21 and 22 in the A/D converter 4 according to the second embodiment. The overflow detectors 25 and 26 detect whether input signals to 10-bit pipelined A/D converters 23 and 24 are saturated, and the overflow detectors 25 and 26 output the detection results to the controller 19.

Since the frame configuration of the wireless packet signal received by the receiver according to the third embodiment is the same as the configuration in the first embodiment, a description thereof will be omitted.

An operation of the A/D converter 4 according to the third embodiment, when a signal constituted by the wireless frame is received, will be described below with reference to FIG. 9. The same reference numerals as in FIG. 5 denote steps which perform the same operations in FIG. 9, and a description thereof will be omitted.

The received signal is separated into an analog I signal and an analog Q signal (step 101 to step 103). Thereafter, the analog I signal and the analog Q signal are input to 10-bit pipelined A/D converters 23 and 24, respectively. At this time, the overflow detectors 25 and 26 detect whether the input signals to the 10-bit pipelined A/D converters 23 and 24 are saturated, and output the detection results to a controller 19 (step 112).

When the overflow detectors 25 and 26 detect that the input signals to the 10-bit pipelined A/D converters 23 and 24 are saturated, the controller 19 generates a coarse adjustment gain control signal (to be referred to as a coarse adjustment signal hereinafter) which designates the variable gain amplifier 12 to decrease the gain of the variable gain amplifier 12, and outputs the coarse adjustment signal to a D/A converter 20. Since the coarse adjustment signal generated and output by the controller 19 is a digital signal, the digital signal is converted into analog signal by a D/A converter 20 to give a gain designation to the variable gain amplifier 12 (step 113). However, when it is detected that the input signals are not saturated, the controller 19 does not change the gain of the variable gain amplifier 12.

The 10-bit digital I signal and the 10-bit digital Q signal converted by the 10-bit pipelined A/D converters 23 and 24 are output to the digital signal processor 5 and output to the power measurement unit 18 as AGC fine adjustment signals (step 114). After the input, as in the first embodiment, AGC fine adjustment is performed on the variable gain amplifier 12 (step 108 and step 109).

As described above, according to the third embodiment, when the overflow detectors 25 and 26 detect that input signals to the 10-bit pipelined A/D converters 23 and 24 are saturated, AGC coarse adjustment of the variable gain amplifier 12 is performed, so that a RSSI detector need not be additionally prepared for AGC coarse adjustment. For this reason, a reduction in circuit scale and a reduction in power consumption can be achieved. Since signals input to or output from the power measurement unit 18 are digital signals, information which is more stable than information obtained by converting the RSSI of an analog signal into a digital signal can be supplied to the controller 19. In addition, since automatic gain control is performed in two steps, the control can be performed at a high speed. In this manner, a preamble signal for automatic gain control can be shortened, and preamble signals for time synchronization or frequency synchronization can be longly assured. That is, a ratio of other signals to a packet length can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal receiving method for a receiving device, the receiving device receiving a radio signal and including: a frequency converter converting a frequency of an analog signal from the receiver; an A/D converter converting the analog signal into a digital signal; and a digital signal processor processing the digital signal to obtain received data, the method comprising:

adjusting a signal level of the analog signal from the frequency converter;

separating a signal from the variable gain amplifier to an in-phase component and a quadrature component;

removing higher harmonic waves included in the in-phase component of the analog signal from the quadrature detector;

removing higher harmonic waves included in the quadrature component of the analog signal from the quadrature detector;

converting an analog signal from the first low-pass filter into an m-bit digital signal of the in-phase component and an n-bit (n>m) digital signal of the in-phase component and outputting the m-bit digital signal and the n-bit digital signal of the in-phase component, the n-bit digital signal of the in-phase component serving as an output signal to the digital signal processor;

converting an analog signal from the second low-pass filter into an m-bit digital signal of the quadrature component and an n-bit digital signal of the quadrature component and outputting the m-bit digital signal and the n-bit digital signal of the quadrature component, the n-bit digital signal of the quadrature component serving as an output signal to the digital signal processor;

calculating a coarse adjustment gain of the variable gain amplifier on the basis of a power of the m-bit digital signal of the in-phase component and the m-bit digital signal of the quadrature component to control the gain of the variable gain amplifier and calculating a fine adjustment gain on the basis of a power of the n-bit digital signal of the in-phase component and the n-bit digital signal of the quadrature component to control the gain of the variable gain amplifier.

2. The method according to claim 1, wherein the m-bit digital signal is a higher-order m-bit of the conversion output signal converted by an n-bit pipeline conversion, and the n-bit digital signal is an all-bit conversion signal converted by the n-bit pipeline conversion.

3. The method according to claim 1, wherein
when converting an analog signal from the first low-pass filter, an m-bit in-phase component digital signal is generated and is output, and an n-bit in-phase component digital signal is generated and output, and when converting an analog signal from the second low-pass filter, an m-bit quadrature component digital signal is generated and output, and an n-bit quadrature component digital signal is generated and output.

4. The method according to claim 2, wherein
when converting an analog signal from the first low-pass filter, an m-bit in-phase component digital signal is generated and is output, and an n-bit in-phase component digital signal is generated and output, and when converting an analog signal from the second low-pass filter, an m-bit quadrature component digital signal is generated and output, and an n-bit quadrature component digital signal is generated and output.

5. The method according to claim 1, wherein amplitudes of the signals from the first and the second low-pass filters are about ¼ to ½ of an amplitude of saturating signals from the first and the second low-pass filters that saturate the A/D converter.

6. The method according to claim 2, wherein amplitudes of the signals from the first and the second low-pass filters are about ¼ to ½ of an amplitude of saturating signals from the first and the second low-pass filters that saturate the A/D converter.

* * * * *